(12) United States Patent
Kim et al.

(10) Patent No.: US 10,141,464 B2
(45) Date of Patent: Nov. 27, 2018

(54) SOLAR CELL MODULE

(71) Applicant: LG ELECTRONICS INC., Seoul (KR)

(72) Inventors: Byongsu Kim, Seoul (KR); Sungho Chang, Seoul (KR); Sanghwan Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 282 days.

(21) Appl. No.: 14/814,308

(22) Filed: Jul. 30, 2015

(65) Prior Publication Data

US 2016/0035922 A1     Feb. 4, 2016

(30) Foreign Application Priority Data

Jul. 30, 2014    (KR) ..................... 10-2014-0097634

(51) Int. Cl.
| | |
|---|---|
| H01L 31/049 | (2014.01) |
| H01L 31/056 | (2014.01) |
| H01L 31/042 | (2014.01) |
| B32B 5/14 | (2006.01) |
| B32B 27/08 | (2006.01) |
| B32B 27/30 | (2006.01) |

(Continued)

(52) U.S. Cl.
CPC ............ *H01L 31/049* (2014.12); *B32B 5/142* (2013.01); *B32B 27/08* (2013.01); *B32B 27/304* (2013.01); *B32B 27/322* (2013.01); *B32B 27/36* (2013.01); *H01L 31/042* (2013.01); *H01L 31/056* (2014.12); *B32B 2307/402* (2013.01); *B32B 2307/4026* (2013.01); *B32B 2307/412* (2013.01); *B32B 2307/416* (2013.01); *B32B 2307/7244* (2013.01); *B32B 2457/12* (2013.01); *Y02E 10/52* (2013.01)

(58) Field of Classification Search
None
See application file for complete search history.

(56) References Cited

U.S. PATENT DOCUMENTS

| | | | |
|---|---|---|---|
| 2014/0116495 A1* | 5/2014 | Kim ................. | H02S 40/22 136/246 |
| 2014/0166106 A1* | 6/2014 | Shirasaki ............ | H01L 31/0487 136/256 |
| 2015/0075615 A1* | 3/2015 | Ihara .................... | H01L 31/056 136/259 |

FOREIGN PATENT DOCUMENTS

| | | |
|---|---|---|
| EP | 2803483 A1 | 11/2014 |
| JP | 11-298029 A | 10/1999 |
| JP | 2007-128943 A | 5/2007 |

(Continued)

*Primary Examiner* — Jayne L Mershon
(74) *Attorney, Agent, or Firm* — Birch, Stewart, Kolasch & Birch, LLP

(57) ABSTRACT

A solar cell module is discussed. The solar cell module includes a plurality of solar cells, a light transmission protection part positioned at first surfaces of the plurality of solar cells, a front protection part positioned between the light transmission protection part and the plurality of solar cells, a back sheet positioned at second surfaces of the plurality of solar cells, and a back protection part positioned between the back sheet and the plurality of solar cells. The back sheet includes a first sheet layer including a first area, which overlaps the plurality of solar cells and has a first transmittance, and a second area, which is a remaining portion except the first area and has a second transmittance different from the first transmittance.

13 Claims, 11 Drawing Sheets

(51) Int. Cl.
*B32B 27/32* (2006.01)
*B32B 27/36* (2006.01)

(56) References Cited

FOREIGN PATENT DOCUMENTS

| | | | |
|---|---|---|---|
| WO | WO 2010/092693 A1 | 8/2010 | |
| WO | WO 2013/105522 | * 7/2013 | ............. B32B 27/20 |
| WO | WO 2013/105522 A1 | 7/2013 | |

* cited by examiner

SOLAR CELL MODULE

CROSS-REFERENCE TO RELATED APPLICATION

This application claims priority to and the benefit of Korean Patent Application No. 10-2014-0097634, filed in the Korean Intellectual Property Office on Jul. 30, 2014, the entire contents of which are incorporated herein by reference.

BACKGROUND OF THE INVENTION

Field of the Invention

Embodiments of the invention relate to a solar cell module.

Description of the Related Art

Interests in new renewable energy are recently increasing because of global environmental problems and the depletion of fossil fuels. Thus, a study on solar power generation usable as non-polluting energy sources among the new renewable energy is being briskly carried out.

A solar cell, to which a principle of the solar power generation is applied, is a semiconductor device converting solar light into electric energy. The solar cell is generally manufactured using a single crystal silicon semiconductor, a polycrystalline silicon semiconductor, or an amorphous silicon semiconductor, and has a basic structure similar to a diode.

The solar cell has to be exposed to an external environment for a long period of time, so as to easily absorb the solar light. Therefore, several packaging processes are performed so as to protect the solar cells, and the solar cells are manufactured as a unit. The unit is referred to as a solar cell module.

A sheet used to package the solar cell uses a back sheet having excellent weather resistance and excellent durability, so as to stably protect the solar cell even when the solar cell is exposed to the external environment for 20 years or more.

SUMMARY OF THE INVENTION

In one aspect, there is a back sheet comprising a base layer and a first sheet layer entirely positioned on a first surface of the base layer, the first sheet layer including a first area having a first transmittance and a second area having a second transmittance different from the first transmittance.

The first transmittance of the first area may be greater than the second transmittance of the second area. The first area and the second area may be formed of different materials.

The first area may be transparent or may include a white pigment. The second area may include a white pigment or a black pigment.

The back sheet may further comprise a second sheet layer selectively positioned in at least one of the first area and the second area.

A thickness of the first sheet layer may be different from a thickness of the second sheet layer. The thickness of the second sheet layer may be less than the thickness of the first sheet layer.

The second sheet layer may include a white pigment. In this instance, a thickness of the second sheet layer may be about 1 μm to 30 μm. Further, the second sheet layer may have the first transmittance. In this instance, the second sheet layer may have the first transmittance equal to or greater than about 50% at a wavelength band of 300 nm to 1200 nm.

The second sheet layer may include a black pigment including a perylene-based organic pigment. In this instance, a thickness of the second sheet layer may be about 1 μm to 5 μm. Further, the second sheet layer may have the second transmittance. In this instance, the second sheet layer may have the second transmittance of about 30% at a wavelength band of 300 nm to 1200 nm.

In another aspect, there is a solar cell module comprising a plurality of solar cells, a light transmission protection part positioned at first surfaces of the plurality of solar cells, a front protection part positioned between the light transmission protection part and the plurality of solar cells, a back sheet positioned at second surfaces of the plurality of solar cells, and a back protection part positioned between the back sheet and the plurality of solar cells, wherein the back sheet includes a first sheet layer including a first area, which overlaps the plurality of solar cells and has a first transmittance, and a second area, which is a remaining portion except the first area and has a second transmittance different from the first transmittance.

The back sheet may further include a base layer and a second sheet layer selectively positioned in at least one of the first area and the second area.

The first transmittance of the first area may be greater than the second transmittance of the second area, and the first area and the second area may be formed of different materials.

The first area may be transparent or may include a white pigment.

The second area may include a white pigment or a black pigment.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
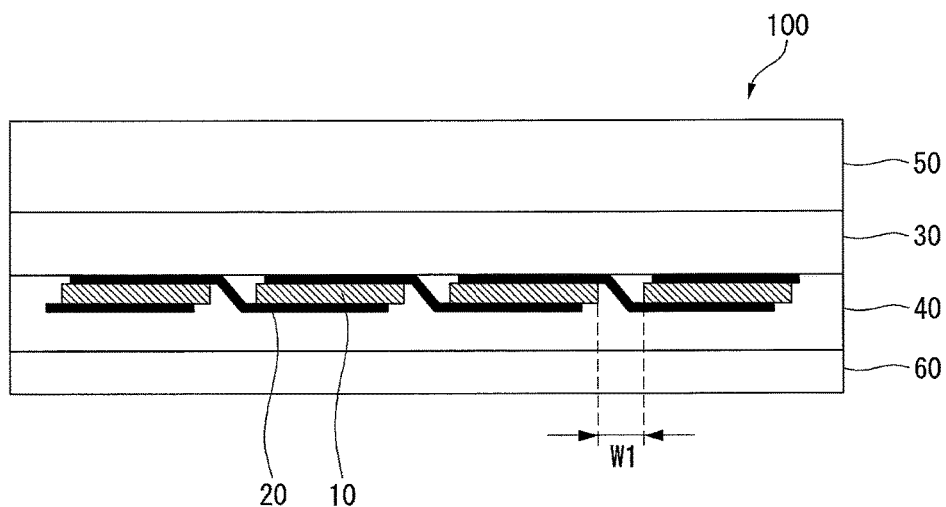
FIGS. 1 and 2 are cross-sectional views schematically showing a solar cell module according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the detailed description of the known arts can lead to misconstruing of the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on other element, it may be on the entire surface of the other element and may not be on a portion of an edge of the other element.

In the following description, "front surface" may be one surface of a semiconductor substrate, on which light is directly incident, and "back surface" may be a surface opposite the one surface of the semiconductor substrate, on which light is not directly incident or reflective light may be incident.

Further, in the following description, the fact that lengths or widths of different components are the same as each other means that they are the same as each other within a margin of error of 10%.

Example embodiments of the invention are described in detail below with reference to FIGS. 1 to 12.

Figure 2:
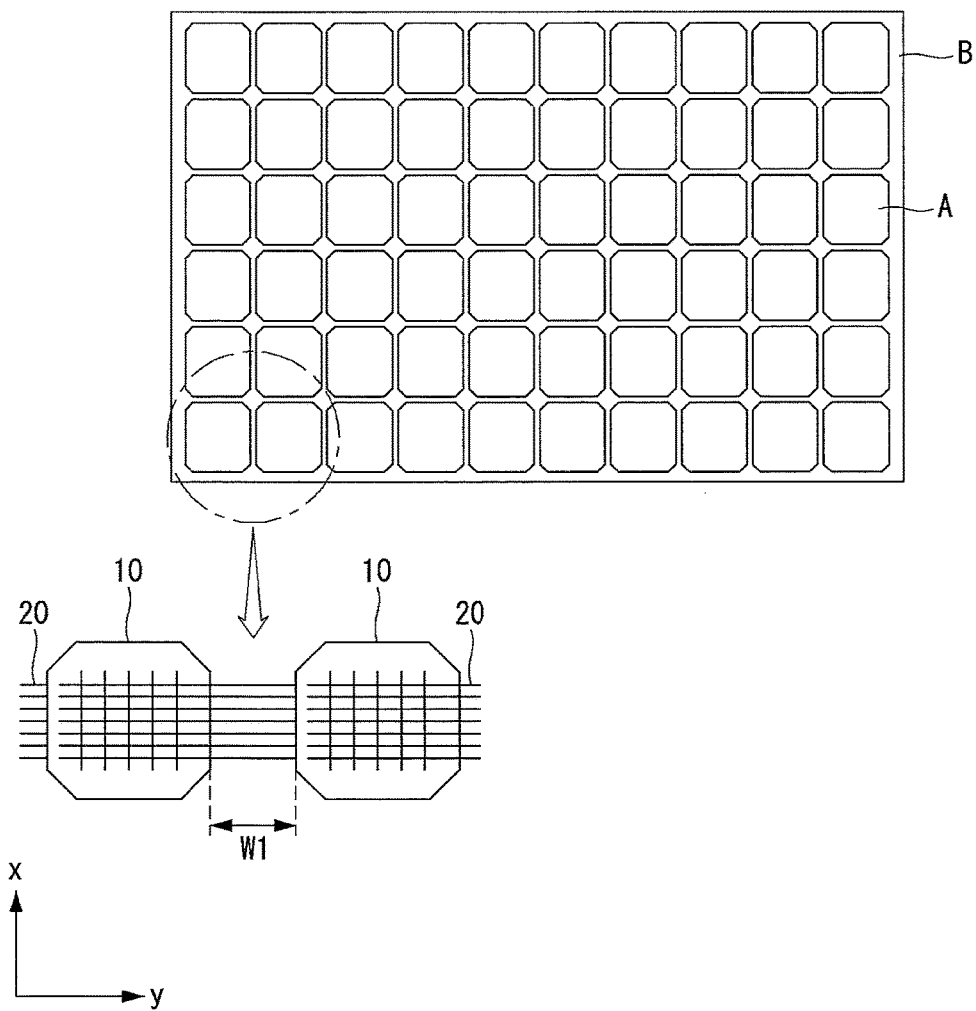

FIGS. 1 and 2 are cross-sectional views schematically showing a solar cell module according to an example embodiment of the invention. More specifically, FIG. 1 shows the solar cell module according to the embodiment of the invention when viewed from the front, and FIG. 2 shows the solar cell module according to the embodiment of the invention when viewed from above.

Referring to FIGS. 1 and 2, a solar cell module 100 according to the embodiment of the invention includes a plurality of solar cells 10, interconnectors 20 electrically connecting the plurality of solar cells 10, a front protection part 30 and a back protection part 40 for protecting the plurality of solar cells 10, a light transmission protection part 50 positioned on front surfaces of the solar cells 10, and a back sheet 60 positioned on back surfaces of the solar cells 10.

As shown in FIGS. 1 and 2, each solar cell 10 is a bifacial solar cell capable of receiving light from the outside through both a front surface and a back surface of a substrate. In this instance, the plurality of solar cells 10 may be separated from one another by a width W1 of about 10 µm to 50 µm.

As shown in FIG. 1, the light transmission protection part 50 is positioned on a first surface, for example, a light receiving surface of the solar cell 10 and is formed of a tempered glass having a high transmittance and a damage prevention function. In this instance, the tempered glass may be a low iron tempered glass containing a small amount of iron. The light transmission protection part 50 may have an embossed inner surface or a textured inner surface, so as to increase a scattering effect of light. The light transmission protection part 50 may have a refractive index of about 1.52.

As shown in FIG. 1, the front protection part 30 and the back protection part 40 are an encapsulation material capable of preventing corrosion of metal resulting from the moisture penetration and protecting the solar cells 10 and the solar cell module 100 from an impact.

The front protection part 30 and the back protection part 40 may be formed of ethylene vinyl acetate (EVA), polyvinyl butyral, silicon resin, ester-based resin, and olefin-based resin. Other materials may be used. The front protection part 30 and the back protection part 40 may be attached to the solar cells 10 through a lamination method.

As shown in FIG. 1, the interconnectors 20 connected to the plurality of solar cells 10 may be buried in the front protection part 30 and the back protection part 40. In this instance, the sides of the solar cells 10 may adjoin both the front protection part 30 and the back protection part 40.

When the interconnector 20 or at least a portion of the interconnector 20 and the solar cell 10 is buried in the front protection part 30, a position of the solar cell 10 is fixed by the front protection part 30. Therefore, the solar cells 10 may be prevented or reduced from being misaligned in a subsequent module process of the solar cells 10.

As shown in FIG. 1, the back sheet 60 is formed using a thin sheet formed of an insulating material such as fluoropolymer/polyester/fluoropolymer (FP/PE/FP). Other insulating materials may be used.

The back sheet 60 prevents moisture and oxygen from penetrating into a back surface of the solar cell module 100, thereby protecting the solar cells 10 from an external environment. The back sheet 60 may have a multi-layered structure including a moisture/oxygen penetrating prevention layer, a chemical corrosion prevention layer, an insulation layer, etc.

Figure 3:
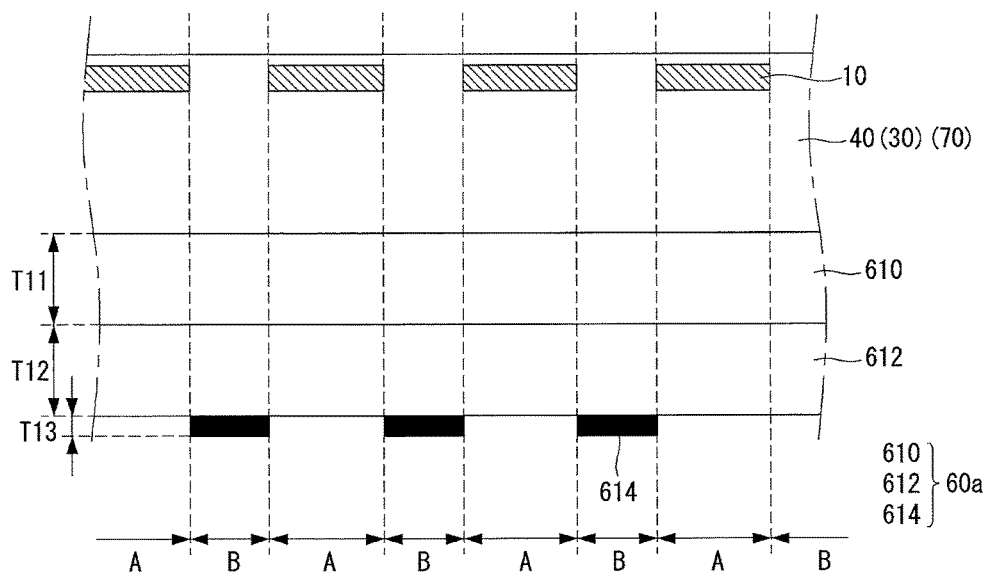
FIG. 3 is a cross-sectional view showing a first embodiment of a back sheet applied to the solar cell module shown in FIG. 1.

Referring to FIG. 3, a back sheet 60a according to the first embodiment of the invention may include a first area A, which is a portion overlapping the solar cell 10 and has a white color, and a second area B, which is a remaining portion except the first area A and has a black color.

The sizes of the first area A and the second area B of the back sheet 60a may vary depending on a formation size of the solar cell 10.

More specifically, the back sheet 60a may include a first sheet layer 610, a base layer 612, and a second sheet layer 614.

The first sheet layer 610 is positioned adjacent to the solar cell 10 and may include a white pigment, a resin, an adhesive material, and a dispersing agent, and the like. The first sheet layer 610 may be formed in the first area A and the second area B.

The first sheet layer 610 may have the white color by the white pigment. The white pigment may increase a reflectance of the back sheet 60a, may have strong durability to ultraviolet light, and may protect the solar cell 10 from ultraviolet light.

In the embodiment of the invention, examples of the white pigment may include titanium dioxide ($TiO_2$), barium sulfate ($BaSO_4$), barium titanate ($BaTiO_3$), strontium titanate ($SrTiO_3$), calcium titanate ($CaTiO_3$), calcium carbonate, lead titanate ($PbTiO_3$), zinc oxide, zinc sulfide, magnesium oxide (MgO), aluminum oxide ($Al_2O_3$), silicon dioxide ($SiO_2$), and zirconium dioxide ($ZrO_2$). In particular, titanium oxide has excellent opacity among the examples of the white pigment, is inactive and is thermodynamically stable, and has a very excellent ultraviolet shielding function. Zinc oxide may extensively filter ultraviolet light.

An average diameter of the white pigment may be 100 nm to 3,000 nm. When the average diameter of the white pigment is less than 100 nm, the manufacturing cost may increase because of a reduction in the average diameter of the white pigment. When the average diameter of the white pigment is greater than 3,000 nm, the ultraviolet shielding function may be reduced.

The first sheet layer 610 may include 20 to 50 parts by weight of the white pigment based on 100 parts by weight of the total amount of the first sheet layer 610. When the first sheet layer 610 includes the white pigment in an amount less than 20 parts by weight, the first sheet layer 610 cannot obtain a desired white level. Further, when the first sheet layer 610 includes the white pigment in an amount exceeding 50 parts by weight, an amount of other components including the resin, the adhesive material, etc., included in the first sheet layer 610 may decrease. Hence, characteristics related to the other components may be reduced. Thus, the first sheet layer 610 may include 30 to 40 parts by weight of the white pigment based on 100 parts by weight of the total amount of the first sheet layer 610, so as to sufficiently obtain the characteristics related to the other components while sufficiently representing the white color.

The resin may include at least one of polytetrafluoroethylene (PTFE), perfluoroalkoxy (PFA), copolymer (FEP) of tetrafluoroethylene (TFE) and hexafluoropropylene, copolymer (EPE) of tetrafluoroethylene (TFE), perfluoroalkyl vinyl ether, and hexafluoropropylene, copolymer (ethylene tetrafluoroethylene, ETFE) of tetrafluoroethylene and ethylene or propylene, polychlorotrifluoroethylene (PCTFE), copolymer (ECTFE) of ethylene and chlorotrifluoroethylene, polyvinylidene fluoride (PVDF), and polyvinyl fluoride (PVF). Because polyvinylidene fluoride (PVDF) is a polymer having a structure of $(CH_2CF_2)n$ and has a structure of a double fluoride molecule, polyvinylidene fluoride (PVDF) has excellent mechanical characteristic, excellent weather resistance, and excellent ultraviolet resistance.

The first sheet layer 610 may include 20 to 80 parts by weight of the resin based on 100 parts by weight of the total amount of the first sheet layer 610. When the first sheet layer 610 includes the resin in an amount less than 20 parts by weight, the reliability of the first sheet layer 610 based on temperature and humidity may be reduced. Further, when the first sheet layer 610 includes the resin in an amount exceeding 80 parts by weight, an amount of other components included in the first sheet layer 610 may greatly decrease. Hence, the first sheet layer 610 cannot obtain a desired effect. For example, when an amount of the resin exceeds 80 parts by weight, the first sheet layer 610 may not have the white color because an amount of the white pigment decreases. Thus, the first sheet layer 610 may include 60 to 80 parts by weight of the resin based on 100 parts by weight of the total amount of the first sheet layer 610, so as to sufficiently secure the amount of the white pigment.

The adhesive material may use various materials, which can stably attach and fix the first sheet layer 610 to the base layer 612 and has an excellent adhesive strength with respect to the back protection part 40. For example, the adhesive material may use acrylic-based adhesive material or urethane-based adhesive material having the excellent adhesive strength with respect to the back protection part 40. Other materials may be used for the adhesive material.

The first sheet layer 610 may include 5 to 40 parts by weight of the adhesive material based on 100 parts by weight of the total amount of the first sheet layer 610. When the first sheet layer 610 includes the adhesive material in an amount less than 5 parts by weight, an adhesive strength of the first sheet layer 610 may not be sufficient. Further, when the first sheet layer 610 includes the adhesive material in an amount exceeding 40 parts by weight, the reliability may be reduced because an amount of the resin decreases. Thus, the first sheet layer 610 may include 20 to 30 parts by weight of the adhesive material based on 100 parts by weight of the total amount of the first sheet layer 610 in consideration of the adhesive strength and the reliability.

The dispersing agent may disperse the white pigment, the resin, and the adhesive material. The dispersing agent may use known materials. When dispersibility of the pigment is improved, a reflectance of the white color may further increase, or a transmittance of the black color may further decrease. Therefore, it is preferable to improve the dispersibility of the pigment. A pigment going through the surface processing may be selectively used, or a pigment dispersing agent with proper humidity may be used, so as to improve the dispersibility of the pigment. A high-speed mixer, a ball mill, or a micro mill may be used to disperse the pigment.

The first sheet layer 610 may include 0.1 to 5.0 parts by weight of the dispersing agent based on 100 parts by weight of the total amount of the first sheet layer 610. When the first sheet layer 610 includes the dispersing agent in an amount less than 0.1 parts by weight, an effect of the dispersing agent cannot be sufficiently obtained. Further, when the first sheet layer 610 includes the dispersing agent in an amount exceeding 5.0 parts by weight, the reliability may be reduced because an amount of the resin decreases. Thus, the first sheet layer 610 may include 0.1 to 0.5 parts by weight of the dispersing agent based on 100 parts by weight of the total amount of the first sheet layer 610 in consideration of the reliability.

The first sheet layer 610 may be formed by mixing the white pigment, the resin, the adhesive material, and the dispersing agent, applying a mixture to the base layer 612, and performing a thermal process and/or a dry process. Various methods may be used as a mixing method, an application method, and a thermal method and/or a dry method. For example, a milling method may be used as the mixing method. Further, an air knife coating method, a dip coating method, a curtain coating method, a reverse roll coating method, a gravure coating method, a metering rod coating method, a slot die coating method, etc., may be used as the application method. The thermal process and/or the dry process may be performed at a temperature of 120° C. to 170° C. for 30 seconds to 5 minutes. The temperature and time in the thermal process and/or the dry process are determined, so that the first sheet layer 610 can be stably formed on the base layer 612. However, the embodiment of the invention is not limited thereto.

A thickness T11 of the first sheet layer 610 may be about 10 μm to 150 μm. When the thickness T11 of the first sheet layer 610 is less than 10 μm, it may be difficult to obtain excellent optical characteristic and excellent adhesive characteristic. When the thickness T11 of the first sheet layer 610 exceeds 150 μm, the manufacturing cost may increase due to an increase in the thickness T11 of the first sheet layer 610.

The first sheet layer 610 reflects light of a specific infrared wavelength and transmits or absorbs light of a remaining infrared wavelength except the specific infrared wavelength. In the embodiment disclosed herein, the reflection of light of the specific infrared wavelength may mean that a reflectance is 100% and an amount of reflected light is more than an amount of transmitted or absorbed light. Further, the transmission or the absorption of light of the remaining infrared wavelength except the specific infrared wavelength may mean that a transmittance or an absorptance is 100% and an amount of transmitted or absorbed light is more than an amount of reflected light.

For example, the first sheet layer 610 reflects most of light having a wavelength band of 800 nm to 1200 nm and transmits or absorbs most of light having a remaining wavelength band except the wavelength band of 800 nm to 1200 nm. Light reflected by the first sheet layer 610 is absorbed in the solar cell 10, and thus the efficiency of the solar cell 10 may increase. In this instance, the light having the wavelength band of 800 nm to 1200 nm may have a transmittance equal to or greater than 30%.

The base layer 612 may support the first sheet layer 610 and the second sheet layer 614, so that the first sheet layer 610 and the second sheet layer 614 can be easily formed. The base layer 612 may be formed in both the first area A and the second area B.

The base layer 612 may include at least one of polyester, polyethylene terephthalate (PET), polyethylene naphthalate (PEN), polybutylene terephthalate (PBT), and polypropylene (PP).

More specifically, polyester is excellent in terms of mechanical characteristic, thermal characteristic, electrical characteristic, moldability, chemical resistance, and the like. Thus, polyester is suitable to protect the solar cell 10.

Polyester may be general polyester or hydrolysis resistant polyester. When general polyester is used for a long period of time, the mechanical characteristic of polyester may be generally reduced by hydrolysis. Hydrolysis resistant polyester may be used in consideration of this. Hydrolysis resistant polyester may be manufactured by adding various materials capable of reducing the hydrolysis to polyester. Examples of the various materials include phosphate, inorganic phosphate, etc., of alkali metal or alkali earth metal or oligomer. In addition, hydrolysis resistant polyester may be manufactured by adjusting molecular weight of polyester. In this instance, molecular weight of hydrolysis resistant polyester may be 8,000 to 10,000. The base layer 612 including general polyester having molecular weight of 6,000 to 8,000 or hydrolysis resistant polyester may use known films or known sheets.

Polyethylene terephthalate (PET) is saturated polyester resin obtained by a condensation reaction of terephthalic acid (HOOC—($C_6H_4$)—COOH) and ethylene glycol ($HOCH_2CH_2OH$). Polypropylene (PP) is a polymer of propylene ($CH_3CH=CH_2$) and is the lightest plastic having specific gravity of 0.82 to 0.92.

Polyethylene terephthalate (PET) and polypropylene (PP) are excellent in terms of thermal resistance, weather resistance, electrical insulation, mechanical strength, and the like. In particular, because polyethylene terephthalate (PET) and polypropylene (PP) have a small contraction percentage of about 0.1% to 0.6% when they are processed, they may prevent the back sheet 60a from being thermally deformed.

A thickness T12 of the base layer 612 may be about 50 μm to 250 μm. When the thickness T12 of the base layer 612 is less than 50 μm, it may be difficult to sufficiently obtain the electrical insulation, the moisture penetration prevention, and the mechanical characteristic. When the thickness T12 of the base layer 612 is greater than 250 μm, it is inconvenient to treat it, and the manufacturing cost may increase due to an increase in the thickness T12 of the base layer 612.

The thickness T12 of the base layer 612 may be equal to or different from the thickness T11 of the first sheet layer 610. For example, the thickness T12 of the base layer 612 may be greater than the thickness T11 of the first sheet layer 610. Alternatively, the thickness T12 of the base layer 612 may be less than the thickness T11 of the first sheet layer 610.

The base layer 612 may be transparent or may have white color. When the base layer 612 has the white color, the base layer 612 may include a white pigment reflecting light having a wavelength band of 800 nm to 1200 nm. Namely, the base layer 612 may reflect light transmitted by the first sheet layer 610 and thus may increase an amount of light incident on the solar cell 10. Hence, an amount of light absorbed in the back surface of the solar cell 10 may increase, and the efficiency of the solar cell 10 may further increase.

The second sheet layer 614 is a layer positioned farthest from the solar cell 10 and is positioned on the back surface of the solar cell module 100. The second sheet layer 614 may include a black pigment and an adhesive material.

The second sheet layer 614 may be positioned in the second area B. Namely, the second sheet layer 614 may be partially positioned on a back surface of the base layer 612. The second sheet layer 614 may be formed with black in a remaining portion except a portion overlapping the solar cell 10. Alternatively, a portion of the second sheet layer 614 may be formed in the first area A.

The second sheet layer 614 may have the black color by the black pigment. When the back sheet 60a has the black color as described above, an appearance of the solar cell module 100 may be improved.

In the first embodiment of the invention, perylene-based organic pigment (i.e., a pigment including perylene derivatives) may be used as the black pigment.

The perylene-based organic pigment reflects most of light having a wavelength band of 800 nm to 1200 nm and transmits most of light having a remaining wavelength band except the wavelength band of 800 nm to 1200 nm.

On the other hand, when carbon black is used as the black pigment, carbon black may absorb most of light of entire wavelength bands, but cannot transmit the light. For example, carbon black has a reflectance less than 5% in light having a wavelength band of 800 nm to 1200 nm. Hence, an amount of light absorbed in the solar cell 10 may decrease, and the efficiency of the solar cell 10 may be reduced.

Accordingly, the perylene-based organic pigment is used as the second sheet layer 614 in the first embodiment of the invention. Hence, a portion of light may be reflected by the back sheet 60a and may be absorbed in the back surface of the solar cell 10, or a portion of light reflected by the back sheet 60a may be again reflected from the light transmission protection part 50 and may be absorbed in the front surface of the solar cell 10. In other words, a portion of light may be reflected by the back sheet 60a including the black pigment and may be absorbed in the front surface and the back surface of the solar cell 10, thereby improving an output of the solar cell module 100.

An average diameter of the black pigment may be equal to or less than 3,000 nm, for example, 100 nm to 3,000 nm. When the average diameter of the black pigment is less than 100 nm, the manufacturing cost may increase because of a reduction in the average diameter of the black pigment. When the average diameter of the black pigment is greater than 3,000 nm, the ultraviolet shielding function may be reduced.

An amount of the black pigment of the second sheet layer 614 may be less than an amount of the white pigment of the first sheet layer 610. This is because the black color can be sufficiently represented by a small amount of the perylene-based organic pigment, but the amount of the white pigment such as titanium oxide and zinc oxide has to increase more than the amount of the black pigment so as to represent the white color.

For example, the second sheet layer 614 may include 1 to 20 parts by weight of the black pigment based on 100 parts by weight of the total amount of the second sheet layer 614. When the second sheet layer 614 includes the black pigment in an amount less than 1 part by weight, the second sheet layer 614 cannot obtain a desired black level. Further, when the second sheet layer 614 includes the black pigment in an amount exceeding 20 parts by weight, the reliability may be reduced because an amount of the resin decreases. Thus, the second sheet layer 614 may include 5 to 15 parts by weight of the black pigment based on 100 parts by weight of the total amount of the second sheet layer 614, so as to prevent an increase in the reflectance while sufficiently representing the black color.

The adhesive material may use various materials capable of stably attaching and fixing the second sheet layer 614 to the base layer 612. For example, the adhesive material may use acrylic-based adhesive material or urethane-based adhesive material. Other materials may be used for the adhesive material.

An amount of the adhesive material of the second sheet layer 614 may be equal to or less than an amount of the adhesive material of the first sheet layer 610. This is because the adhesive material of the first sheet layer 610 requires the high adhesive strength because the first sheet layer 610 is attached to the back protection part 40, but the second sheet layer 614 is not attached to the back protection part 40.

The second sheet layer 614 may include 0 to 40 parts by weight of the adhesive material based on 100 parts by weight of the total amount of the second sheet layer 614. When the second sheet layer 614 includes the adhesive material in an amount exceeding 40 parts by weight, the reliability may be reduced because an amount of the resin decreases. Thus, the second sheet layer 614 may include 0 to 20 parts by weight of the adhesive material based on 100 parts by weight of the total amount of the second sheet layer 614 in consideration of the reliability.

The second sheet layer 614 may be formed by mixing the black pigment and the adhesive material, partially applying a mixture to the base layer 612, and performing a thermal process and/or a dry process. Various methods may be used as a mixing method, an application method, and a thermal method and/or a dry method. Since the mixing method, the application method, and the thermal method and/or the dry method used in the second sheet layer 614 are substantially the same as or similar to the mixing method, the application method, and the thermal method and/or the dry method used in the first sheet layer 610, a further description may be briefly made or may be entirely omitted.

In embodiments of the invention as shown in FIG. 3, for example, the second sheet layer 614 may have a width that is predetermined. For example, the width of the second sheet layer 614 may correspond to that of second area B, and which correspond to the width W1 of the separation of the plurality of solar cells 10. Accordingly, the width of the second sheet layer 614 may be W1. However, such is not necessary, and in other embodiments of the invention, the width of the second sheet layer 614 may be different from W1, such as being greater or lesser. In various embodiments of the invention, one or more of W1, the width of the second sheet layer 614 and the width of the second area B may be the same or different.

Additionally, in embodiments of the invention, the overlaps of the first area A with the plurality of solar cells 10 may be exact or may be off by a small amount.

Also, in FIG. 3, depicted is the plurality of solar cells being disposed in the back protection part 40, but in other embodiments of the invention, the plurality of solar cells may be disposed in other elements, such as the front protection part 30 or the protection part 70, for example.

A thickness T13 of the second sheet layer 614 may be less than the thickness T11 of the first sheet layer 610 and the thickness T12 of the base layer 612.

For example, the thickness T13 of the second sheet layer 614 may be about 1 µm to 5 µm. When the thickness T13 of the second sheet layer 614 is less than 1 µm, an amount of energy, which is not absorbed in the solar cell 10 and is reused, may decrease because the second sheet layer 614 cannot reflect incident light. When the thickness T13 of the second sheet layer 614 is greater than 5 µm, the manufacturing cost may increase. Thus, in the first embodiment of the invention, the thickness T13 of the second sheet layer 614 may be about 2 µm.

When the white first sheet layer 610 is formed of polyethylene terephthalate (PET) and the white base layer 612 is formed of polypropylene (PP) in the back sheet 60a having the above-described structure according to the first embodiment of the invention, the thickness T11 of the white first sheet layer 610 may be about 125 µm and the thickness T12 of the white base layer 612 may be about 120 µm. In this instance, the thickness T13 of the black second sheet layer 614 may be about 2 µm.

Figure 4:
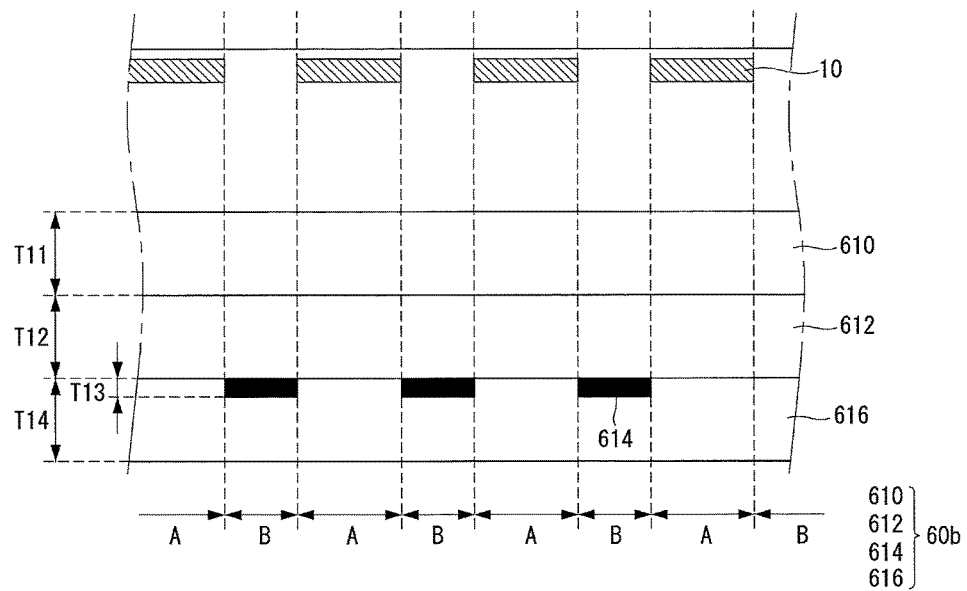
FIG. 4 is a cross-sectional view showing a second embodiment of a back sheet applied to the solar cell module shown in FIG. 1.

FIG. 4 is a cross-sectional view showing a second embodiment of the back sheet applied to the solar cell module shown in FIG. 1.

Since configuration of a back sheet 60b according to the second embodiment of the invention is substantially the same as configuration of the back sheet 60a according to the first embodiment of the invention except a third sheet layer 616, only the third sheet layer 616 is described below. Thus, structures and components of the second embodiment identical or equivalent to the first embodiment are designated with the same reference numerals as the first embodiment, and a further description may be briefly made or may be entirely omitted.

Referring to FIG. 4, the back sheet 60b according to the second embodiment of the invention may include a first sheet layer 610, a base layer 612, a second sheet layer 614, and a third sheet layer 616.

The third sheet layer 616 is positioned on a back surface of the base layer 612 or a back surface of the second sheet layer 614 and may be formed in a first area A and a second area B.

The third sheet layer 616 may include an adhesive material capable of stably attaching and fixing the second sheet layer 614 to the base layer 612. The adhesive material may be formed of ethylene vinyl acetate (EVA), polyvinyl butyral, silicon resin, ester-based resin, and olefin-based resin. Other materials may be used. The third sheet layer 616 may be attached through a lamination method.

A thickness T14 of the third sheet layer 616 may be about 30 µm to 100 µm. When the thickness T14 of the third sheet layer 616 is less than 30 µm, it may be difficult to obtain excellent adhesive characteristic. When the thickness T14 of the third sheet layer 616 exceeds 100 µm, the manufacturing cost may increase due to an increase in the thickness T14 of the third sheet layer 616.

When the white first sheet layer 610 and the white base layer 612 are formed of polyethylene terephthalate (PET) in the back sheet 60b having the above-described structure according to the second embodiment of the invention, the thickness T11 of the white first sheet layer 610 may be about 36 µm and the thickness T12 of the white base layer 612 may be about 188 µm. In this instance, the thickness T13 of the black second sheet layer 614 may be about 2 µm, and the thickness T14 of the white third sheet layer 616 may be about 60 µm.

Figure 5:
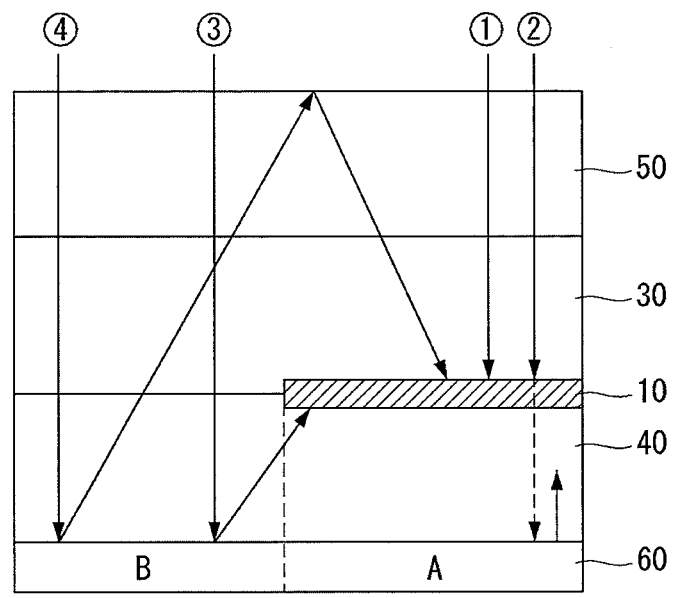
FIG. 5 shows a reflection path of light applied to the solar cell module shown in FIG. 1.

FIG. 5 shows a reflection path of light applied to the solar cell module shown in FIG. 1.

More specifically, FIG. 5 shows a reflection path of light applied to the back sheets 60a and 60b according to the first and second embodiments of the invention when light having a wavelength band of 800 nm to 1200 nm is incident on the solar cell module according to the embodiment of the invention.

In a first path ①, light having the wavelength band of 800 nm to 1200 nm may be absorbed in the front surface of the solar cell 10. Hence, electric power may be generated in the front surface of the solar cell 10, and the efficiency of the solar cell 10 may be improved.

In a second path ②, light having the wavelength band of 800 nm to 1200 nm may be transmitted by the solar cell 10, may be reflected by the first sheet layer 610 including the white pigment of the back sheets 60a and 60b, and may be again incident on the back surface of the solar cell 10. Namely, the light of the wavelength band of 800 nm to 1200 nm may be reflected by the white first area A and then may be absorbed in the back surface of the solar cell 10. Hence, electric power may be generated in the back surface of the solar cell 10, and the efficiency of the solar cell module 100 may be further improved. In a related art, light of the wavelength band of 800 nm to 1200 nm is not reflected by the white first area A and is transmitted by the back sheets 60a and 60b, thereby reducing the efficiency of the solar cell 10.

In a third path ③, light having the wavelength band of 800 nm to 1200 nm may be reflected by the second sheet layer 614 including the black pigment of the back sheets 60a and 60b and may be again incident on the back surface of the solar cell 10. Namely, the light of the wavelength band of 800 nm to 1200 nm may be reflected by the black second area B and then may be absorbed in the back surface of the solar cell 10. Hence, electric power may be generated in the back surface of the solar cell 10, and the efficiency of the solar cell module 100 may be further improved. In a related art, light of the wavelength band of 800 nm to 1200 nm is not reflected by the black second area B and is transmitted by the back sheets 60a and 60b, thereby reducing the efficiency of the solar cell 10.

In a fourth path ④, light having the wavelength band of 800 nm to 1200 nm may be reflected by the second sheet layer 614 including the black pigment of the back sheets 60a and 60b, and a portion of the reflected light may be again reflected by the light transmission protection part 50 and may be absorbed in the front surface of the solar cell 10. Hence, the portion of the reflected light may be reflected by the black second area B and may be absorbed in the front surface of the solar cell 10, thereby improving an output of the solar cell module 100.

As described above, each of the back sheets 60a and 60b according to the first and second embodiments of the invention may include the white first area A corresponding to a portion overlapping the solar cell 10 and the black second area B corresponding to a remaining portion except the first area A. Light of the wavelength band of 800 nm to 1200 nm transmitted by the solar cell 10 may be reflected by the white pigment of the first area A and may be absorbed in the back surface of the solar cell 10 through the second path ②, and light of the wavelength band of 800 nm to 1200 nm incident on the second area B may be reflected by the black pigment of the second area B and may be incident on the back surface of the solar cell 10 through the third path ③, or may be again reflected by the light transmission protection part 50 and may be incident on the front surface of the solar cell 10 through the fourth path ④. Hence, electric power may be generated in both the front surface and the back surface of the solar cell 10, and the efficiency of the solar cell module 100 may be further improved.

Figure 6:
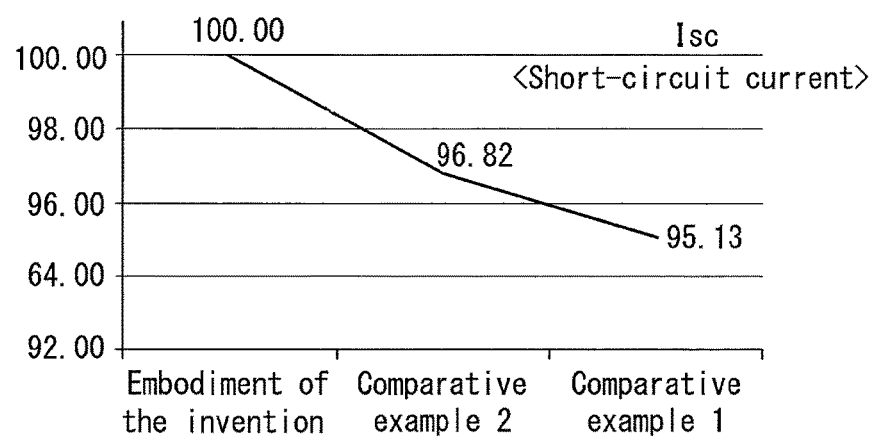
FIG. 6 is a graph showing a short-circuit current of a solar cell module including a back sheet shown in FIGS. 3 and 4 and a short-circuit current of a comparative example.
Figure 7:
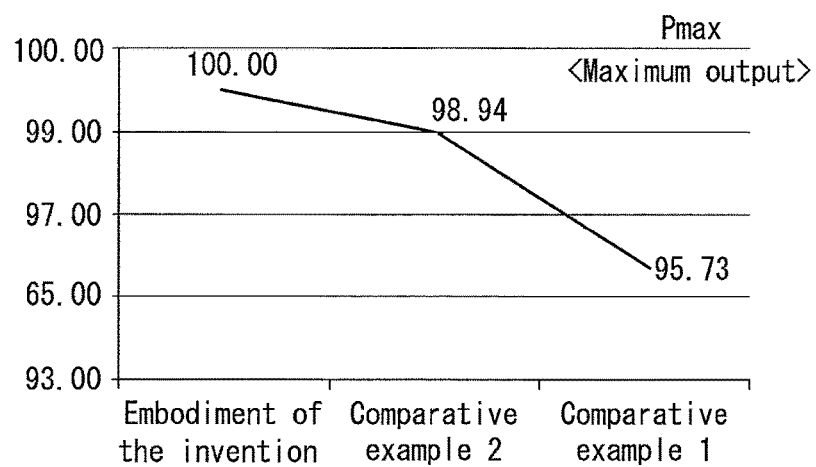
FIG. 7 is a graph showing a maximum output of a solar cell module including a back sheet shown in FIGS. 3 and 4 and a maximum output of a comparative example.

FIG. 6 is a graph showing a short-circuit current depending on an amount of light collected by the solar cell module according to the embodiment of the invention shown in FIG. 1. FIG. 7 is a graph showing a maximum output depending on an amount of light collected by the solar cell module according to the embodiment of the invention shown in FIG. 1.

A short-circuit current depending on an amount of collected light in the first and second embodiments of the invention and comparative examples 1 and 2 is described with reference to FIG. 6.

In the comparative example 1, when a black sheet layer is formed on an entire front surface or an entire back surface of a back sheet, a short-circuit current Isc depending on an amount of collected light is about 95.13.

In the comparative example 2, when a white sheet layer is formed on an entire back surface of a back sheet and a black sheet layer is formed on an entire front surface or the entire back surface of the back sheet, a short-circuit current Isc depending on an amount of collected light is about 96.82.

A short-circuit current Isc depending on an amount of collected light in the first and second embodiments of the invention is about 100, the short-circuit current Isc in the comparative example 1 is about 95.13, and the short-circuit current Isc in the comparative example 2 is about 96.82. In this instance, incident light has a wavelength band of 800 nm to 1200 nm.

Accordingly, as described above, the first and second embodiments of the invention include the white first area A corresponding to a portion overlapping the solar cell 10 having a high reflectance at the wavelength band of 800 nm to 1200 nm and the black second area B corresponding to a remaining portion except the first area A, unlike the comparative examples 1 and 2. Hence, because light is absorbed in both the front surface and the back surface of the solar cell 10 in the first and second embodiments of the invention, the short-circuit current Isc in the first and second embodiments of the invention are greater than the short-circuit current Isc in the comparative examples 1 and 2.

More specifically, carbon black formed on an entire front surface or an entire back surface of a solar cell according to the comparative example 1 can absorb light throughout the entire area of the solar cell, but cannot transmit the light. For example, carbon black has a high reflectance less than 5% at a wavelength band of 300 nm to 1200 nm.

Accordingly, in the first and second embodiments of the invention, because the black second sheet layer 614 including the perylene-based organic pigment having the high reflectance at the wavelength band of 800 nm to 1200 nm is formed in an area between the solar cells 10 except a formation area of the solar cells 10, light may be reflected by the black second sheet layer 614 and may be absorbed in the back surface of the solar cell 10. Further, light reflected by the black second sheet layer 614 may be again reflected by the light transmission protection part 50 and may be absorbed in the front surface of the solar cell 10. Hence, because light is absorbed in both the front surface and the back surface of the solar cell 10 in the first and second embodiments of the invention, the efficiency of the solar cell module 100 may be further improved.

As can be seen from FIG. 6, the short-circuit current Isc in the first and second embodiments of the invention is greater than the short-circuit current Isc in the comparative example 1 including carbon black by about 5%.

A solar cell according to the comparative example 2 includes a black sheet layer including carbon black and a white sheet layer having a low reflectance at the wavelength band of 800 nm to 1200 nm.

Accordingly, in the first and second embodiments of the invention, light transmitted by the solar cell 10 may be again absorbed in the back surface of the solar cell 10 due to the black second sheet layer 614 having the high reflectance at the wavelength band of 800 nm to 1200 nm, thereby improving the efficiency of the solar cell 10.

As can be seen from FIG. 6, the short-circuit current Isc in the first and second embodiments of the invention is greater than the short-circuit current Isc in the comparative example 2 including carbon black by about 4%.

A maximum output Pmax depending on an amount of collected light in the first and second embodiments of the invention and comparative examples 1 and 2 is described with reference to FIG. 7. Since the conditions in the first and second embodiments of the invention and the comparative examples 1 and 2 in FIG. 7 are substantially the same as FIG. 6, a further description may be briefly made or may be entirely omitted.

A maximum output Pmax depending on an amount of collected light in the first and second embodiments of the invention is about 100, a maximum output Pmax in the comparative example 1 is about 95.73, and a maximum output Pmax in the comparative example 2 is about 98.94. In this instance, incident light has a wavelength band of 800 nm to 1200 nm.

The maximum output Pmax in the first and second embodiments of the invention is greater than the maximum output Pmax in the comparative example 1 including a black sheet layer containing carbon black by about 5% and is greater than the maximum output Pmax in the comparative example 2 including a black sheet layer containing carbon black and a white sheet layer by about 2%.

Figure 8:
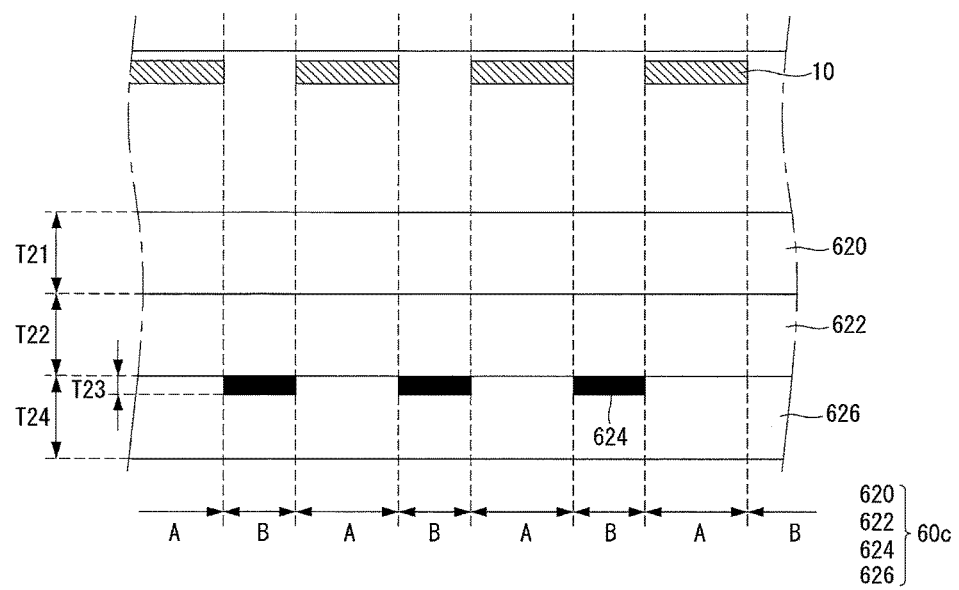
FIG. 8 is a cross-sectional view showing a third embodiment of a back sheet applied to the solar cell module shown in FIG. 1.

FIG. 8 is a cross-sectional view showing a third embodiment of the back sheet applied to the solar cell module shown in FIG. 1.

Referring to FIG. 8, a back sheet 60c according to the third embodiment of the invention may include a first area A, which is a transparent portion overlapping the solar cell 10, and a second area B, which is a remaining portion except the first area A and has a white color.

The sizes of the first area A and the second area B of the back sheet 60c may vary depending on a formation size of the solar cell 10.

More specifically, the back sheet 60c may include a first sheet layer 620, a base layer 622, a second sheet layer 624, and a third sheet layer 626.

The first sheet layer 620 is a transparent layer positioned adjacent to the solar cell 10 and may include a resin, an adhesive material, and the like.

The first sheet layer 620 may be formed in the first area A and the second area B.

The resin may include at least one of polyethylene terephthalate (PET), polyethylene (PE), polypropylene (PP), ethylene vinyl acetate (EVA), polyvinyl fluoride (PVF), polyvinylidene fluoride (PVDF), and copolymer (ethylene tetrafluoroethylene, ETFE) of tetrafluoroethylene and ethylene or propylene.

The adhesive material may use various materials, which can stably attach and fix the first sheet layer 620 to the base layer 622 and has an excellent adhesive strength with respect to the back protection part 40. For example, the adhesive material may use acrylic-based adhesive material or urethane-based adhesive material having the excellent adhesive strength with respect to the back protection part 40. Other materials may be used for the adhesive material.

The first sheet layer 620 may be formed by mixing the resin and the adhesive material, applying a mixture to the base layer 622, and performing a thermal process and/or a dry process. Various methods may be used as a mixing method, an application method, and a thermal method and/or a dry method. For example, a milling method may be used as the mixing method. Further, an air knife coating method, a dip coating method, a curtain coating method, a reverse roll coating method, a gravure coating method, a metering rod coating method, a slot die coating method, etc., may be used as the application method. The thermal process and/or the dry process may be performed at a temperature of 120° C. to 170° C. for 30 seconds to 5 minutes. The temperature and time in the thermal process and/or the dry process are determined, so that the first sheet layer 620 can be stably formed on the base layer 622. However, the embodiment of the invention is not limited thereto.

A thickness T21 of the first sheet layer 620 may be about 5 μm to 200 μm. When the thickness T21 of the first sheet layer 620 is less than 5 μm, it may be difficult to obtain excellent optical characteristic and excellent adhesive characteristic.

Further, when the thickness T21 of the first sheet layer 620 exceeds 200 μm, the manufacturing cost may increase due to an increase in the thickness T21 of the first sheet layer 620.

The first sheet layer 620 reflects light of a specific infrared wavelength and transmits or absorbs light of a remaining infrared wavelength except the specific infrared wavelength. In the embodiment disclosed herein, the reflection of light of the specific infrared wavelength may mean that a reflectance is 100% and an amount of reflected light is more than an amount of transmitted or absorbed light. Further, the transmission or the absorption of light of the remaining infrared wavelength except the specific infrared wavelength may mean that a transmittance or an absorptance is 100% and an amount of transmitted or absorbed light is more than an amount of reflected light.

For example, the first sheet layer 620 reflects most of light having a wavelength band of 300 nm to 1200 nm and transmits or absorbs most of light having a remaining wavelength band except the wavelength band of 300 nm to 1200 nm. Light reflected by the first sheet layer 620 is absorbed in the solar cell 10, and thus the efficiency of the solar cell 10 may increase. In this instance, the light having the wavelength band of 300 nm to 1200 nm may have a transmittance equal to or greater than 50%.

The base layer 622 may support the first sheet layer 620, the second sheet layer 624, and the third sheet layer 626, so that the first sheet layer 620, the second sheet layer 624, and the third sheet layer 626 can be easily formed. The base layer 622 may be formed in both the first area A and the second area B.

The base layer 622 may include polyethylene terephthalate (PET).

Polyethylene terephthalate (PET) is saturated polyester resin obtained by a condensation reaction of terephthalic acid (HOOC—$C_6H_4$—COOH) and ethylene glycol (HOCH$_2$CH$_2$OH). Polyethylene terephthalate (PET) is excellent in terms of thermal resistance, weather resistance, electrical insulation, mechanical strength, and the like. In particular, because polyethylene terephthalate (PET) has a small contraction percentage of about 0.1% to 0.6% when it is processed, it may prevent the back sheet 60a from being thermally deformed.

A thickness T22 of the base layer 622 may be about 60 μm to 300 μm. When the thickness T22 of the base layer 622 is less than 60 μm, it may be difficult to sufficiently obtain the electrical insulation, the moisture penetration prevention, and the mechanical characteristic. When the thickness T22 of the base layer 622 is greater than 300 μm, it is inconvenient to treat it, and the manufacturing cost may increase due to an increase in the thickness T22 of the base layer 622.

The base layer 622 is transparent and may reflect light having a wavelength band of 300 nm to 1200 nm. Namely, the base layer 622 may reflect light transmitted by the first sheet layer 620 and thus may increase an amount of light reflected on the solar cell 10. Hence, an amount of light absorbed in the back surface of the solar cell 10 may increase, and the efficiency of the solar cell 10 may be further improved.

The second sheet layer 624 is partially positioned on a back surface of the base layer 622 and may include a white pigment and an adhesive material.

The second sheet layer 624 may be positioned in the second area B. Namely, the second sheet layer 624 may be formed in a remaining portion except a portion overlapping the solar cell 10 with a white color. In this instance, the second sheet layer 624 may be formed in the first area A.

The second sheet layer 624 may have the white color by the white pigment. The white pigment may increase a reflectance of the back sheet 60c, may have strong durability to ultraviolet light, and may protect the solar cell 10 from ultraviolet light.

In the embodiment of the invention, examples of the white pigment may include titanium dioxide ($TiO_2$), barium sulfate ($BaSO_4$), barium titanate ($BaTiO_3$), strontium titanate ($SrTiO_3$), calcium titanate ($CaTiO_3$), calcium carbonate, lead titanate ($PbTiO_3$), zinc oxide, zinc sulfide, magnesium oxide (MgO), aluminum oxide ($Al_2O_3$), silicon dioxide ($SiO_2$), and zirconium dioxide ($ZrO_2$). In particular, titanium oxide has excellent opacity among the examples of the white pigment, is inactive and is thermodynamically stable, and has a very excellent ultraviolet shielding function. Zinc oxide may extensively filter ultraviolet light.

The white second sheet layer 624 reflects most of light having a wavelength band of 300 nm to 1200 nm and transmits or absorbs most of light having a remaining wavelength band except the wavelength band of 300 nm to 1200 nm. Light reflected by the second sheet layer 624 is absorbed in the solar cell 10, and thus the efficiency of the solar cell 10 may increase. In this instance, the light having the wavelength band of 300 nm to 1200 nm may have a transmittance equal to or greater than 30%. Namely, the second sheet layer 624 reflects light having the wavelength band of 300 nm to 1200 nm using not a black pigment but the white pigment and causes the reflected light to be again incident on the front surface and the back surface of the solar cell 10, thereby further increasing the efficiency of the solar cell 10.

Accordingly, referring to FIG. 5, when the second sheet layer 624 includes the white pigment in the wavelength band of 300 nm to 1200 nm, a portion of light is reflected from the back sheet 60c and is absorbed in the back surface of the solar cell 10 through the third path ③. Alternatively, a portion of light reflected by the back sheet 60c may be again reflected by the light transmission protection part 50 and may be incident on the front surface of the solar cell 10 through the fourth path ④. Hence, because a portion of light is reflected by the back sheet 60c including the white pigment and is absorbed in both the front surface and the back surface of the solar cell 10, an output of the solar cell module 100 may be improved.

As a result, the back sheet 60c including the white pigment according to the third embodiment of the invention may have the maximum output Pmax greater than a related art back sheet, of which an entire front surface or an entire back surface is formed as a transparent layer, by about 2% to 4% and may obtain an amount of electric power more than the related art back sheet by about 0.5%.

The adhesive material may use various materials capable of stably attaching and fixing the second sheet layer 624 to the base layer 622. For example, the adhesive material may use acrylic-based adhesive material or urethane-based adhesive material. Other materials may be used for the adhesive material.

An amount of the adhesive material of the second sheet layer 624 may be equal to or less than an amount of the adhesive material of the first sheet layer 620. This is because the adhesive material of the first sheet layer 620 requires the high adhesive strength because the first sheet layer 620 is attached to the back protection part 40, but the second sheet layer 624 is not attached to the back protection part 40.

The second sheet layer 624 may be formed by mixing the white pigment and the adhesive material, partially applying a mixture to the base layer 622, and performing a thermal process and/or a dry process. Various methods may be used as a mixing method, an application method, and a thermal method and/or a dry method. Since the mixing method, the application method, and the thermal method and/or the dry method used in the second sheet layer 624 are substantially the same as or similar to the mixing method, the application method, and the thermal method and/or the dry method used in the first sheet layer 620, a further description may be briefly made or may be entirely omitted.

A thickness T23 of the second sheet layer 624 may be less than the thickness T21 of the first sheet layer 620 and the thickness T22 of the base layer 622.

For example, the thickness T23 of the second sheet layer 624 may be about 1 μm to 30 μm. When the thickness T23 of the second sheet layer 624 is less than 1 μm, an amount of energy, which is not absorbed in the solar cell 10 and is reused, may decrease because the second sheet layer 624 cannot reflect incident light. When the thickness T23 of the second sheet layer 624 is greater than 30 μm, the manufacturing cost may increase.

The third sheet layer 626 is positioned on a back surface of the base layer 622 or a back surface of the second sheet layer 624 and may be formed in the first area A and the second area B.

The third sheet layer 626 may include an adhesive material capable of stably attaching and fixing the second sheet layer 624 to the base layer 622. The adhesive material may be formed of polyethylene terephthalate (PET), polyvinyl fluoride (PVF), polyvinylidene fluoride (PVDF), and copolymer (ethylene tetrafluoroethylene, ETFE) of tetrafluoroethylene and ethylene or propylene. Other materials may be used. The third sheet layer 626 may be attached through a lamination method.

A thickness T24 of the third sheet layer 626 may be about 10 µm to 80 µm. When the thickness T24 of the third sheet layer 626 is less than 10 µm, it may be difficult to obtain excellent adhesive characteristic. When the thickness T24 of the third sheet layer 626 exceeds 80 µm, the manufacturing cost may increase due to an increase in the thickness T24 of the third sheet layer 626.

As described above, the back sheet 60c according to the third embodiment of the invention may include the transparent first area A corresponding to a portion overlapping the solar cell 10 and the white second area B corresponding to a remaining portion except the first area A. Light of the wavelength band of 300 nm to 1200 nm transmitted by the solar cell 10 may be reflected by the transparent first area A and may be absorbed in the back surface of the solar cell 10 through the second path ②, and light of the wavelength band of 300 nm to 1200 nm incident on the second area B may be reflected by the white pigment of the second area B and may be incident on the back surface of the solar cell 10 through the third path ③, or may be again reflected by the light transmission protection part 50 and may be incident on the front surface of the solar cell 10 through the fourth path ④. Hence, electric power may be generated in both the front surface and the back surface of the solar cell 10, and the efficiency of the solar cell module 100 may be further improved. In this instance, the thickness T21 of the transparent first sheet layer 620 may be about 5 µm to 200 µm, the thickness T22 of the transparent base layer 622 may be about 60 µm to 300 µm, the thickness T23 of the white second sheet layer 624 may be about 1 µm to 30 µm, and the thickness T24 of the transparent third sheet layer 626 may be about 10 µm to 80 µm.

Figure 9:
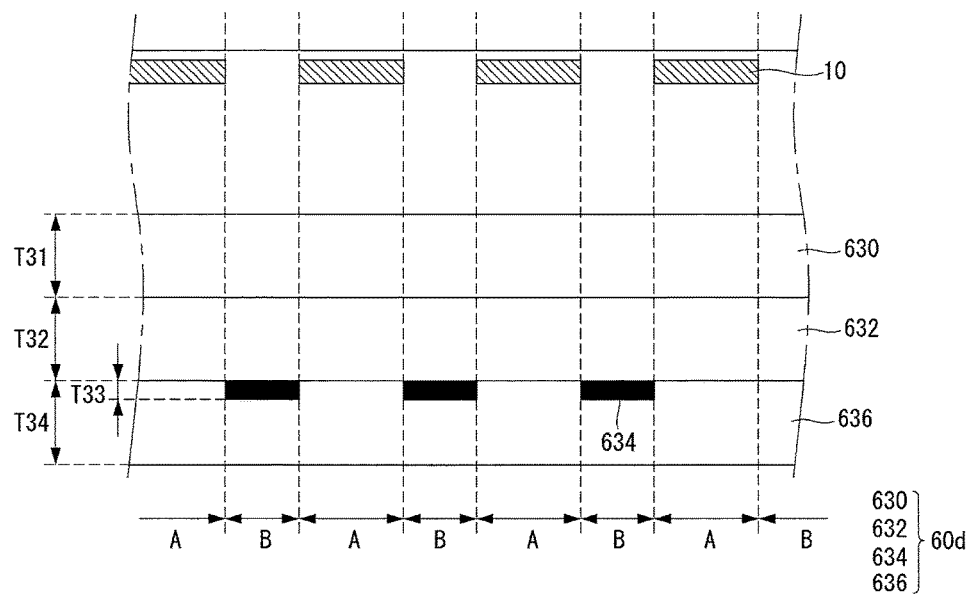
FIG. 9 is a cross-sectional view showing a fourth embodiment of a back sheet applied to the solar cell module shown in FIG. 1.

FIG. 9 is a cross-sectional view showing a fourth embodiment of a back sheet applied to the solar cell module shown in FIG. 1.

Since configuration of a back sheet 60d according to the fourth embodiment of the invention is substantially the same as configuration of the back sheet 60c according to the third embodiment of the invention except a black second sheet layer 634, only the black second sheet layer 634 is described below. Thus, structures and components of the fourth embodiment identical or equivalent to the third embodiment are designated with the same reference numerals as the third embodiment, and a further description may be briefly made or may be entirely omitted.

Referring to FIG. 9, the back sheet 60d according to the fourth embodiment of the invention may include a first area A, which is a transparent portion overlapping the solar cell 10, and a second area B, which is a remaining portion except the first area A and has a black color.

More specifically, the back sheet 60d according to the fourth embodiment of the invention may include a first sheet layer 630, a base layer 632, a second sheet layer 634, and a third sheet layer 636.

The second sheet layer 634 may be partially positioned on a back surface of the base layer 632. The second sheet layer 634 may include a black pigment and an adhesive material.

The second sheet layer 634 may be positioned in the second area B. Namely, the second sheet layer 634 may be formed with black in a remaining portion except a portion overlapping the solar cell 10. In this instance, a portion of the second sheet layer 634 may be positioned in the first area A.

The second sheet layer 634 may have the black color by the black pigment. When the back sheet 60d has the black color as described above, an appearance of the solar cell module 100 may be improved.

In the fourth embodiment of the invention, perylene-based organic pigment (i.e., a pigment including perylene derivatives) may be used as the black pigment.

The perylene-based organic pigment reflects most of light having a wavelength band of 300 nm to 1200 nm and transmits light having a remaining wavelength band except the wavelength band of 300 nm to 1200 nm.

On the other hand, when carbon black is used as the black pigment, carbon black may absorb most of light of entire wavelength bands, but cannot transmit the light. For example, carbon black has a reflectance less than 5% in light having a wavelength band of 300 nm to 1200 nm. Hence, an amount of light absorbed in the solar cell 10 may decrease, and the efficiency of the solar cell 10 may be reduced.

Accordingly, the perylene-based organic pigment is used as the second sheet layer 634 in the fourth embodiment of the invention. Hence, a portion of light may be reflected by the back sheet 60d and may be absorbed in the back surface of the solar cell 10, or a portion of light reflected by the back sheet 60d may be again reflected from the light transmission protection part 50 and may be absorbed in the front surface of the solar cell 10. In other words, a portion of light may be reflected by the back sheet 60d including the black pigment and may be absorbed in the front surface and the back surface of the solar cell 10, thereby improving an output of the solar cell module 100.

The black second sheet layer 634 reflects most of light having a wavelength band of 300 nm to 1200 nm and transmits or absorbs most of light having a remaining wavelength band except the wavelength band of 300 nm to 1200 nm. Light reflected by the second sheet layer 634 is absorbed in the solar cell 10, and thus the efficiency of the solar cell 10 may increase. In this instance, the light having the wavelength band of 300 nm to 1200 nm may have a transmittance equal to or greater than 50%.

Accordingly, referring to FIG. 5, when the second sheet layer 634 includes the black pigment in the wavelength band of 300 nm to 1200 nm, a portion of light is reflected from the back sheet 60d and is absorbed in the back surface of the solar cell 10 through the third path ③. Alternatively, a portion of light reflected by the back sheet 60d may be again reflected by the light transmission protection part 50 and may be incident on the front surface of the solar cell 10 through the fourth path ④. Hence, because a portion of light is reflected by the back sheet 60d including the black pigment and is absorbed in both the front surface and the back surface of the solar cell 10, an output of the solar cell module 100 may be improved.

As a result, the back sheet 60d including the black pigment according to the fourth embodiment of the invention may have the maximum output Pmax greater than a related art back sheet, of which an entire front surface or an entire back surface is formed as a transparent layer, by about 0.5% to 1% and may obtain an amount of electric power more than the related art back sheet by about 0.2%.

A thickness T33 of the second sheet layer 634 may be less than a thickness T31 of the first sheet layer 630 and a thickness T32 of the base layer 632.

For example, the thickness T33 of the second sheet layer 634 may be about 1 µm to 5 µm. When the thickness T33 of the second sheet layer 634 is less than 1 µm, an amount of energy, which is not absorbed in the solar cell 10 and is reused, may decrease because the second sheet layer 634 cannot reflect incident light. When the thickness T33 of the second sheet layer 634 is greater than 5 µm, the manufacturing cost may increase. Thus, in the fourth embodiment of the invention, the thickness T33 of the second sheet layer 634 may be about 2 µm.

As described above, the back sheet 60d according to the fourth embodiment of the invention may include the transparent first area A corresponding to a portion overlapping the solar cell 10 and the black second area B corresponding to a remaining portion except the first area A. Light of the wavelength band of 300 nm to 1200 nm transmitted by the solar cell 10 may be reflected by the transparent first area A and may be incident on the back surface of the solar cell 10 through the second path ②, and light of the wavelength band of 300 nm to 1200 nm incident on the second area B may be reflected by the black pigment of the second area B and may be incident on the back surface of the solar cell 10 through the third path ③, or may be again reflected by the light transmission protection part 50 and may be incident on the front surface of the solar cell 10 through the fourth path ④. Hence, electric power may be generated in both the front surface and the back surface of the solar cell 10, and the efficiency of the solar cell module 100 may be further improved. In this instance, the thickness T31 of the transparent first sheet layer 630 may be about 5 µm to 200 µm, the thickness T32 of the transparent base layer 632 may be about 60 µm to 300 µm, the thickness T33 of the black second sheet layer 634 may be about 1 µm to 5 µm, and the thickness T34 of the transparent third sheet layer 636 may be about 10 µm to 80 µm. The above-described solar cell module 100 may be manufactured through the following method.

Silicon resin for a front protection part is left on one surface of the light transmission protection part 50 for a predetermined period of time (for example, 30 seconds to 60 seconds) and is leveled. A frame of a predetermined height is installed to surround the light transmission protection part 50 and may prevent the silicon resin from flowing out of the light transmission protection part 50.

Subsequently, a front substrate, to which liquid silicon resin is applied, is disposed in an oven and is cured at a temperature (for example, 90° C. to 110° C.) equal to or higher than 80° C. Hence, the liquid silicon resin is cured to form the front protection part 30. The front protection part 30 is attached to the light transmission protection part 50 through a curing process, and a surface opposite one surface (attached to the light transmission protection part 50) of the front protection part 30 is formed as an uneven surface.

Next, the plurality of solar cells 10 are disposed on the front protection part 30, and silicon resin for a back protection part is applied to the front protection part 30 and then is left for 30 seconds to 60 seconds. Afterwards, the silicon resin applied on the front protection part 30 is leveled.

In this instance, a process for applying the liquid silicon resin for the back protection part may be performed in a state where a frame is installed, in the same manner as the liquid silicon resin for the front protection part.

According to the process for applying and leveling the silicon resin for the back protection part, the liquid silicon resin is filled in a space between the adjacent solar cells 10 and in a space between the solar cell 10 and the front protection part 30.

The base layer 612 formed of polyethylene terephthalate (PET) or polypropylene (PP) is provided. A white pigment, a resin, an adhesive material, and a dispersing agent are applied to a front surface of the base layer 612 through the gravure coating method to form the first sheet layer 610 of about 10 µm on the front surface of the base layer 612. Further, a black pigment including perylene-based organic pigment and an adhesive material are applied to a back surface of the base layer 612 through the gravure coating method to form the second sheet layer 614 of about 10 µm on the back surface of the base layer 612.

Namely, the back sheet 60a including the first sheet layer 610, the base layer 612, and the second sheet layer 614 is disposed. In this instance, a third sheet layer may be disposed on a back surface of the black second sheet layer 614.

Alternatively, the second sheet layer may have the white color, and the base layer and the first and third sheet layers may be transparent.

Next, the silicon resin for the back protection part is cured to form the back protection part 40 attached to the back sheet 60. Hence, the solar cell module 100 is completed. The process for curing the silicon resin for the back protection part may be performed in the oven at a temperature (for example, 90° C. to 110° C.) equal to or higher than 80° C., in the same manner as the silicon resin for the front protection part. Alternatively, the process for curing the silicon resin for the back protection part may be performed using a general lamination equipment.

A solar cell module according to another example embodiment of the invention is described below with reference to FIGS. 10 to 12. Structures and components identical or equivalent to those illustrated in FIGS. 1 and 2 are omitted in FIGS. 10 to 12, and a difference therebetween is mainly described.

Figure 10:
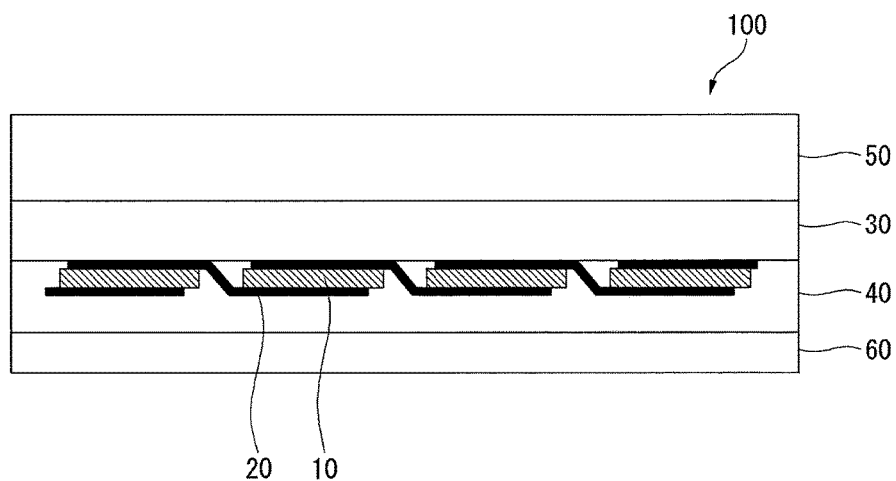
FIGS. 10 to 12 are cross-sectional views schematically showing a solar cell module according to another example embodiment of the invention.

Referring to FIG. 10, interconnectors 20 connected to a plurality of solar cells 10 may adjoin a back surface of a front protection part 30 and a front surface of a back protection part 40. In this instance, front surfaces of the solar cells 10 are covered by the front protection part 30, and back surfaces and sides of the solar cells 10 are covered by the back protection part 40.

When a thickness of the back protection part 40 positioned at the back surfaces of the solar cells 10 is greater than a thickness of the front protection part 30, the back protection part 40 may more stably protect the solar cells 10 from an external impact or a pollutant and may increase weather resistance of the solar cell module 100, thereby increasing the life span of the solar cell module 100.

Figure 11:
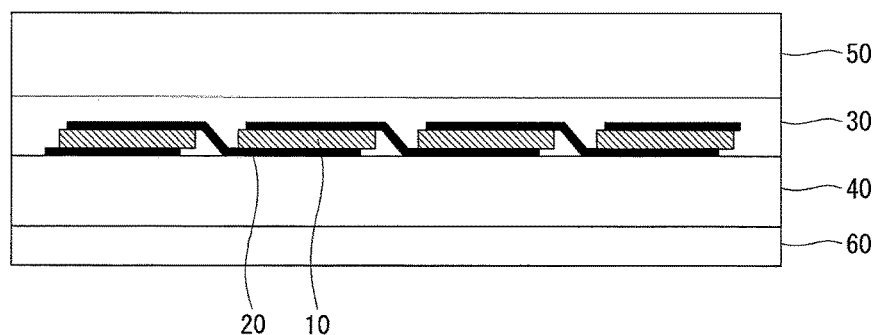

Further, as shown in FIG. 11, the interconnectors 20 connected to the plurality of solar cells 10 may be buried in the front protection part 30. In this instance, the solar cells 10 may be covered by the front protection part 30.

Figure 12:
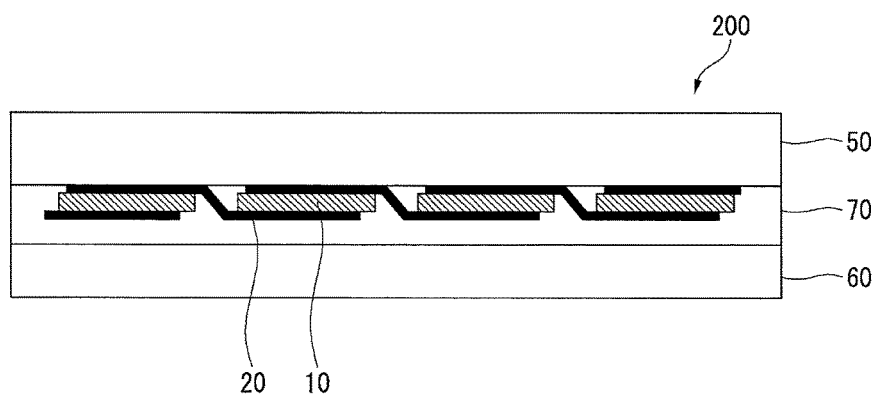

As shown in FIG. 12, a solar cell module 200 according to another example embodiment of the invention includes a plurality of solar cells 10, interconnectors 20 electrically connecting the plurality of solar cells 10, a protection part 70 for protecting the plurality of solar cells 10, a light transmission protection part 50 positioned on front surfaces of the solar cells 10, and a back sheet 60 positioned on back surfaces of the solar cells 10. The protection part 70 may have a single-layered structure.

Since configuration of the solar cell module 200 shown in FIG. 12 is substantially the same as configuration of the solar cell module 100 shown in FIG. 1 except the protection part 70 having the single-layered structure, only a position relationship between the protection part 70, the interconnectors 20, and the solar cells 10 is described below.

Thus, structures and components of the solar cell module 200 of FIG. 12 identical or equivalent to the solar cell module 100 of FIG. 1 are designated with the same reference numerals as the solar cell module 100 of FIG. 1, and a further description may be briefly made or may be entirely omitted.

The interconnectors 20 connected to the plurality of solar cells 10 may adjoin a back surface of the light transmission protection part 50 and a front surface of the protection part 70. In this instance, front surfaces of the solar cells 10 may be covered by the light transmission protection part 50, and back surfaces and sides of the solar cells 10 are covered by the protection part 70.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    a plurality of bi-facial solar cells having a front surface and a back surface, respectively, wherein light is incident to both of the front surface and the back surface of each of the plurality of bi-facial solar cells;
    a light transmission protection part positioned on the front surfaces of the plurality of bi-facial solar cells;
    a front protection part positioned between the light transmission protection part and the front surfaces of the plurality of bi-facial solar cells;
    a back sheet positioned on the back surfaces of the plurality of bi-facial solar cells, wherein the back sheet includes a first area overlapping the plurality of bi-facial solar cells and having a first transmittance, and a second area being a remaining portion except the first area and having a second transmittance different from the first transmittance; and
    a back protection part positioned between the back sheet and the back surfaces of the plurality of bi-facial solar cells,
    wherein the back sheet includes:
        a base layer,
        a first sheet layer positioned between a first surface of the base layer and the back protection part,
        a second sheet layer selectively positioned on a second surface of the base layer to correspond to the second area, and
        a third sheet layer positioned on the second surface of the base layer and on the second sheet layer.

2. The solar cell module of claim 1, wherein the first transmittance of the first area is greater than the second transmittance of the second area, and
    wherein the first sheet layer and the second sheet layer are formed of different materials.

3. The solar cell module of claim 2, wherein the second area is white or black.

4. The solar cell module of claim 1, wherein the first area is transparent or white.

5. The solar cell module of claim 1, wherein the second sheet layer includes a white pigment and a resin.

6. The solar cell module of claim 1, wherein the second sheet layer includes a black pigment and a resin.

7. The solar cell module of claim 1, wherein a thickness of the second sheet layer is about 1 μm to 30 μm.

8. The solar cell module of claim 1, wherein the second sheet layer has the first transmittance equal to or greater than about 50% at a wavelength band of 300 nm to 1200 nm.

9. The solar cell module of claim 1, wherein the plurality of bi-facial solar cells are separated from one another by a width of about 10 μm to 50 μm.

10. The solar cell module of claim 1, wherein the third sheet layer is the outmost layer of the back sheet.

11. The solar cell module of claim 1, wherein a thickness of the second sheet layer is less than a thickness of the first sheet layer.

12. The solar cell module of claim 1, wherein the first sheet layer or the second sheet layer includes a white pigment, and
    wherein the white pigment includes at least one of titanium dioxide ($TiO_2$), barium sulfate ($BaSO_4$), barium titanate ($BaTiO_3$), strontium titanate ($SrTiO_3$), calcium titanate ($CaTiO_3$), calcium carbonate, lead titanate ($PbTiO_3$), zinc oxide, zinc sulfide, magnesium oxide (MgO), aluminum oxide ($Al_2O_3$), silicon dioxide ($SiO_2$), and zirconium dioxide ($ZrO_2$).

13. The solar cell module of claim 6, wherein the black pigment includes a perylene-based organic pigment or carbon.

* * * * *